US008086950B2

(12) United States Patent
Smith et al.

(10) Patent No.: US 8,086,950 B2
(45) Date of Patent: Dec. 27, 2011

(54) METHOD AND SYSTEM FOR ENHANCING ENGINEERING INFORMATION

(75) Inventors: Mark D. Smith, Huntsville, AL (US); John D. Simmons, Madison, AL (US)

(73) Assignee: Bentley Systems, Inc., Exton, PA (US)

( * ) Notice: Subject to any disclaimer, the term of this patent is extended or adjusted under 35 U.S.C. 154(b) by 1828 days.

(21) Appl. No.: 11/210,759

(22) Filed: Aug. 25, 2005

(65) Prior Publication Data

US 2006/0048127 A1 Mar. 2, 2006

Related U.S. Application Data

(60) Provisional application No. 60/604,083, filed on Aug. 25, 2004.

(51) Int. Cl.
*G06F 17/27* (2006.01)
(52) U.S. Cl. ...................................... 715/208
(58) Field of Classification Search .................. 715/208
See application file for complete search history.

(56) References Cited

U.S. PATENT DOCUMENTS 6,587,746 B1 * 7/2003 D'Souza ................... 700/182
6,993,708 B1 * 1/2006 Gillig ......................... 715/234
2002/0112114 A1 * 8/2002 Blair et al. ................. 711/100
2003/0185433 A1 * 10/2003 Harding ..................... 382/152
2005/0256874 A1 * 11/2005 Chiba et al. ................. 707/10

OTHER PUBLICATIONS

"Plotting Microstation Data," pp. 1-76, www.bentley.com, May 5, 2004.
"Using Design Scripts/Pens Tables," pp. 1-20, http://docs.bentley.com/en/PDFComposer/pdfcomposer29.html, Aug. 4, 2005.
"Using Design Scripts/Pen Tables," pp. 1-8, http://docs.bentley.com/en/PDFComposer/pdfcomposer28.html, Aug. 4, 2005.
"How to Use Microstation PDF Composer," pp. 1-6, www.bentley.com, Aug. 4, 2005.

* cited by examiner

*Primary Examiner* — Laurie Ries
*Assistant Examiner* — Tionna Smith
(74) *Attorney, Agent, or Firm* — Venable LLP; Jeffri A. Kaminski; Christopher Ma

(57) ABSTRACT

A system and method for adding features to an electronic file is provided. The electronic file can be automatically examined to identify information that relates to features such as navigational aids or enhanced content. Certain information is defined to represent the navigational aids or enhanced content. When the information representing the navigational aid or enhanced content is located in the electronic file, the navigational aid or enhanced content is added to the electronic file. Bookmarks, internal links, web links, attachments, digital signatures and multimedia files are some examples of navigational aids and enhanced content that may be added to the electronic file, although other items may also be included.

14 Claims, 6 Drawing Sheets

FIG. 1
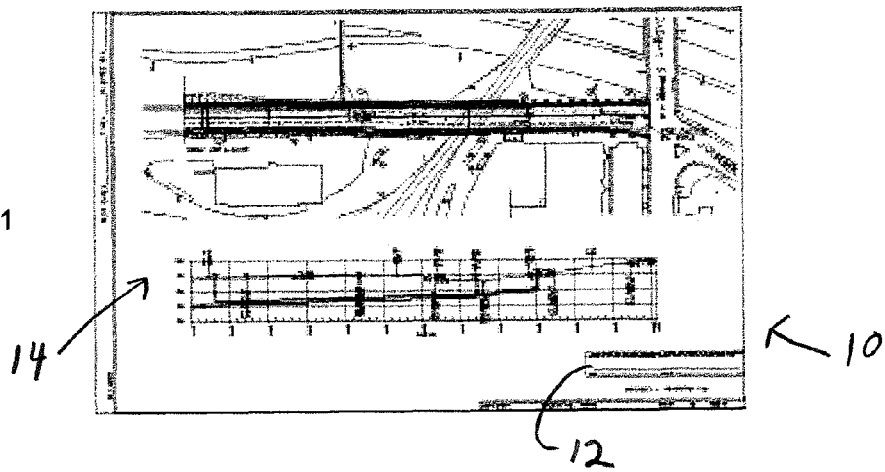
FIG. 2
(PRIOR ART)
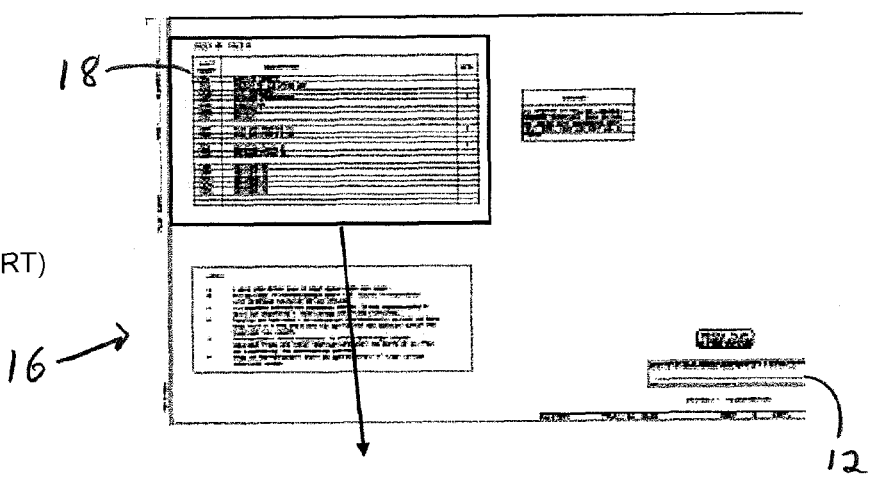
FIG. 3
Inventor: Mark Smith et al.
Title of Invention: Method and System for
Enhancing Engineering Information
Attorney Docket No.: 36488-206882
VENABLE

US 8,086,950 B2

METHOD AND SYSTEM FOR ENHANCING ENGINEERING INFORMATION

RELATED APPLICATIONS

This application claims priority from U.S. Provisional Patent Application Ser. No. 60/604,083 filed Aug. 25, 2004, the entire contents of which are incorporated herein.

BACKGROUND OF THE INVENTION

1. Field of the Invention

The invention relates to automatic generation of additional content that allow users of electronic information, such as electronic plots, to navigate, find, and understand information.

2. Related Art

Computer Aided design and drafting tools (CAD), such as CAD software, is well-known, and used by architects, engineers, designers, planners, and the like to create precision models and technical illustrations. It is used to create two-dimensional (2-D) drawings, maps, and three-dimensional (3-D) models. CAD software may be used to design buildings, highways and the like. Applications such as MicroStation® products, which are developed by Bentley Systems, Inc., Exton, Pa. U.S.A., and AutoCAD® products, which are developed by Autodesk, Inc., San Rafael, Calif., U.S.A., are typical of such CAD software, which may be used in the engineering, construction, and operations (ECO) marketplace.

Engineering information generated by CAD software consists of large format engineering plans (engineering drawings) and specifications. FIG. 1 is an example of an engineering plan sheet 10. The plan sheet 10 includes a title block 12 that includes identifying information for the plan sheet and one or more drawings 14. Engineering plan sets are collections of plan sheets. There are established methods used in the engineering community for reading plan sets. Typically plan sets contain an index sheet that serves as a table of contents for the set. FIG. 2 is an example of a sheet index 16. The sheet index 16 includes a title block 12 and an index 18 of all plan sheets in the plan set.

FIG. 3 is a magnified view of the index 18. Index 18 typically includes the sheet number, sheet name and descriptive information regarding the sheet. The sheet number, name and descriptive information enable those reading the engineering plans to navigate to the appropriate sheet within the document set just like a Table of Contents in a book enables readers to navigate to the appropriate page, section, or chapter of the book. In addition to sheet indexes there are graphics included on engineering plan sheets that enable readers to navigate from a plan sheet to a drawing detail. The graphics include the sheet number, and detail name where an illustration that provides more detailed information can be found.

An example of a graphic is shown in FIG. 4. FIG. 4 indicates that a detailed illustration of the information contained in the circle can be found on sheet number 9-9 and the detail name on that sheet is Y. The above are examples of the types of graphical navigation aids that are often found in engineering plan sets. Techniques like the ones described above have been used on engineering drawings for decades, prior to the use of computers to create engineering drawings.

With the advent of CAD tools the collection of graphics that represent the index table or drawing detail references have been constructed using the basic features of the CAD tool. Although each organization using a particular CAD tool may represent detail references using different CAD primitives, most organizations are consistent within its members. In other words, all draftsmen within an organization using the CAD tool represent the detail reference the same way. To ensure consistency most organizations issue CAD standards that their draftsmen are required to comply with.

When the CAD data is published, these navigational aids may be used by a reader to navigate among the plan set. In this context publishing refers to taking the information in a CAD file and presenting the information to a reader in a paper or electronic paper form. The information in an e-paper form may be enhanced by added electronic navigational aids and enhanced content. There are two established methods to enhance the content of published engineering information in e-paper forms.

The first method is to manually edit the published content. This method is offered and prescribed by Adobe. After creating the electronic paper the publisher would use Adobe Acrobat's editing tool to add navigational aids, such as bookmarks, etc. For example, the publisher would use features of Acrobat to establish areas of interest for the "Notes", "Disclaimer" etc. Bookmarks may be created using other commands in the Acrobat environment. Digital Signature fields and file attachments could also be created using interactive editing features of Acrobat. The disadvantage of this method is that the editing steps must be repeated every time a new version of the plans and specifications are created. The user creates plans and specifications in PDF form. The PDF is then edited to enhance its content. As the design evolves through the project life cycle the same edits would have to be reapplied over and over again each time the CAD data is published. For the life cycle of an asset this could be hundreds or even thousands of times. Consequently, this method is very expensive and time consuming. Other vendors provide solutions similar to Adobe's using other industry standard e-paper formats like Cals and Tiff image data.

The second method is to extend the concepts in the CAD tool to encompass navigational aids and enhance content for publishing purposes. This approach has been deployed by AutoDesk in their 2005 release of AutoCAD. This method avoids the labor intensive redundant editing that is required using the first method. However, this method has its disadvantages. One such disadvantage is that this method cannot be used to enhance published content on older CAD files. The engineering design must be done using AutoCAD 2005. This means that all assets that have been designed using CAD over the last several decades and that are now being renovated cannot realize the benefits of today's publishing technology during their renovation without recreating all of the CAD data using the extended CAD tool.

Navigation and information are easy for professional engineers to determine on visual inspection of a plan set, but difficult to describe programmatically. It is necessary to describe the relationships and associations between selected graphics within and across multiple sheets in a plan set. Accordingly, there is a need for a system and method that can overcome the disadvantages of previous systems.

SUMMARY OF THE INVENTION

Embodiments of the invention provide a method for adding intelligence to a computer file, comprising: receiving a computer file including data; receiving definition information that defines a feature; identifying data in the file that represents the feature based on the definition information; causing the feature to be created in the computer file.

Further embodiments of the invention provide a method comprising receiving a CAD file including data in a first format; identifying at least one of graphics or text in the CAD file that corresponds to a feature; extracting the identified graphics or text; interpreting the extracting graphics or text to identify the feature and obtain feature information; and creating a second file including the data in a second format and the identified feature.

Further embodiments of the invention provide A computer readable medium including computer code for causing a computer to perform the steps of: identifying at least one of graphics or text in a first computer file that correspond to preselected graphics and text; and determining a navigational aid that corresponds to the identified graphics or text based on a definition of the navigational aid. Additional embodiments create a second computer file corresponding to the first computer file in a second format; and cause the navigational aid to be created in the second computer file.

BRIEF DESCRIPTION OF THE DRAWINGS

The foregoing and other features and advantages of the invention will be apparent from the following, more particular description of a preferred embodiment of the invention, as illustrated in the accompanying drawings wherein like reference numbers generally indicate identical, functionally similar, and/or structurally similar elements.

FIG. 1 depicts an example of an engineering plan sheet;
FIG. 2 depicts an example of a sheet index;
FIG. 3 depicts an example of a sheet index.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

Embodiments of the present invention provide a system and method for adding features to an electronic file. The electronic file can be automatically examined to identify information that relates to features such as navigational aids or enhanced content. Certain information is defined to represent the navigational aids or enhanced content. One example of this is the drafting standards discussed above. When the information representing the navigational aid or enhanced content is located in the electronic file, the navigational aid or enhanced content is added to the electronic file. Bookmarks, internal links, web links, attachments, digital signatures and multimedia files are some examples of navigational aids and enhanced content that may be added to the electronic file, although other items may also be included. An embodiment of the invention is described below in the context of CAD files and electronic plots, however, the invention can also be applied to many other fields.

Figure 4:
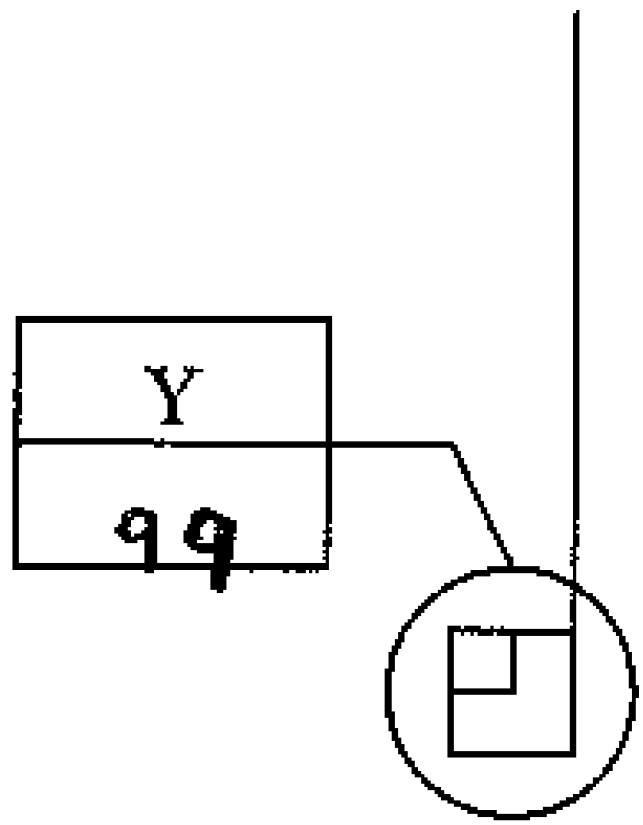
FIG. 4 depicts graphics on an engineering plan sheet.

As described above, a CAD file may be created based on standards. Information can be identified, extracted and interpreted from the CAD file based on the definition of the graphics and text in the CAD design. For example, the detail reference shown in FIG. 4 may be represented in MicroStation or AutoCAD as a cell or block that contains a shape, two lines and two pieces of text. The drafting standard defines such a cell or block as a detail reference. CAD standards may be used to identify relevant graphics in the CAD design. The CAD file is examined to identify cells or blocks that contains a shape, two lines and two pieces of text as a detail reference. The CAD file can also be examined to identify other graphics and text that identify other navigational aids and enhanced content.

Once the information regarding the graphics and text is identified, the information is extracted and interpreted. In this example, a cell or block that contains a shape, two lines and two pieces of text has been identified. The graphics and text for the detail reference are extracted and interpreted. This may be done based on the properties of the information identified. Based on the applicable definition, for example for the CAD standard, such a cell is identified as a detail reference. Based on the definition of a detail reference, it is known that a detail reference includes a sheet number and detail name. A detail reference includes a sheet number in the bottom portion of the square and the detail name in the top portion of the square. The graphics and text of the detail reference are interpreted to obtain the sheet number and detail name based on the location of the text. Here, the detail reference indicates that the sheet number is 9-9 and the detail name on that sheet is Y.

Based on the interpretation of the information, the next step may be to cause the identified feature to be added to the electronic file. In the case of a detail reference, a link from the detail reference to the detail Y on sheet 9-9 is caused to be created. The source of the link is the detail reference. In order for a link to be created, the target for the link must be identified based on the interpretation of the detail reference. It is known that the target is detail Y on sheet 9-9. Therefore, the CAD file is examined to identify detail Y on sheet 9-9. Once the target is located, the link is created.

One method of providing the definitions of CAD data that represent the additional features is a scripting language. A scripting language is provided that enables organizations to describe their CAD standards and describe how to automatically create electronic navigation aids and enhance the information to assist the reader in navigating and understanding the collective engineering information (plans and specifications).

An example of a scripting language is provided below. The example scripting language is provided with Bentley Systems' Microstation PDF Composer. Other scripting languages may be used and would be apparent to one of ordinary skill in the art. MicroStation PDF Composer is a Windows application for publishing PDF documents from plots and plot sets. The method of the present invention may be applied when a CAD design is published. This typically involves taking the CAD file which is in a first format, such as .DGN or .DWG, and converting the CAD file to a second format, such as .PDF, Autodesk's DWF, Microsoft's XPS (XML Paper Specification), or some other format. The method for identifying and adding features may be performed as part of the application authoring the CAD file or part of the publishing software. In either case, the navigational aids and enhanced content should become part of the published plan set.

The CAD design may be published as a PDF document that contains audio or video instructions, bookmarks, internal PDF document links, Web URL Links, attachments that contain project specifications and other files. The example scripting language includes keywords. The keywords are predefined and are used to assign an attribute to an element or to compare an elements existing attributes to values defined in the script.

The following keyword descriptions include a brief description of the keyword function, the types of elements the keyword affects (if applicable), the valid data type(s) (if applicable), and an example of how to use the keyword.

| ACTION KEYWORDS | GLOBAL ACTION KEYWORDS |
|---|---|
| ACTION_ITEM | SHEET_NAME |
| ACTION_TYPE | IGNORE_ENGINEERING_LINKS |
| ACTION_NAME | IGNORE_CUSTOM_LINKS |
| ACTION_SPEC | IGNORE_ALL_LINKS |
| ACTION_RANGE | BOOKMARK_TEMPLATE |
| ACTION_INSTANCE | ZOOM_PERCENTAGE |
|  | FIRST_TIME |
|  | ELEMENT_URL |
|  | ELEMENT_URL_DESCRIPTION |

In this example, the first action_* keyword is action_item followed by action_name. The remaining action keywords, action_type, action_spec, action_range, and action_instance can be listed in any order.

ACTION_ITEM

Specifies the type of action you want to create. This is a required field when defining an action item in an active rendition. The first action keyword in a design script is ACTION_ITEM followed by ACTION_NAME. The following constants are valid for the ACTION_ITEM keyword:

Field—Specifies that the ACTION_ITEM you are creating is a field. A field is a location where user input is collected, like a Digital Signature Field.

Bookmark—Specifies that the ACTION_ITEM you are creating is a bookmark. A bookmark is a single line item in a Table of contents. Bookmarks allow for quick navigation to a point of interest on a sheet, or they can also perform actions, such as playing a sound or opening a URL. Other keywords of interest when using a BOOKMARK may be BOOKMARK_TEMPLATE in the Global Action Keywords section.

Link—Specifies that the ACTION_ITEM you are creating is a link. A link is a rectangular region on a sheet that has navigation action associated with it, like a Web URL or an Inter-Document link.

Marker—Specifies that the ACTION_ITEM you are creating is a marker. A marker denotes an area of interest on the sheet that marks a destination for navigation. A marker is identified by a unique name. The software automatically prepends the sheet_name to the marker name. The fully qualified marker name is "sheet_name.marker_name. Other keywords of interest when using a MARKER may be ZOOM_PERCENTAGE in the Global Action Keywords section.

Attachment—Specifies that the ACTION_ITEM you are creating is a file, sound, or movie attachment.

Media—Specifies that the ACTION_ITEM you are creating is for playing media. Media is either sound or a movie.

Syntax
ACTION_ITEM=<LINK|BOOKMARK|MARKER|MEDIA|FIELD|ATTACHMENT>

ACTION_TYPE

Specifies that type of action associated with the previous ACTION_ITEM assignment. This is a required field when defining an ACTION_ITEM. The following constants are valid for the ACTION_TYPE keyword:

WEB_URL—Specifies that the type of action associated with the ACTION_ITEM is a standard Web URL. Used for ACTION_ITEM=BOOKMARK or ACTION_ITEM=LINK.

DESTINATION—Specifies that the type of action associated with the ACTION_ITEM is a named destination on the sheet. Used for ACTION_ITEM=MARKER. The name of the current sheet (SHEET_NAME) is automatically prepended to the ACTION_NAME to associate it with the sheet. For example, if ACTION_NAME="Air Handler" and the name of the sheet was "Plumbing Schematics" the resulting unique name for the destination would be "Plumbing Schematics.Air Handler."

DOCUMENT—Specifies that the type of action associated with the ACTION_ITEM is a link to jump to a view or region on the same sheet, or to a view or region on another sheet in the PDF document. Used for ACTION_ITEM=BOOKMARK or ACTION_ITEM=LINK.

PLAY_SOUND—Specifies that the type of action associated with the ACTION_ITEM is to play a sound clip. Used for ACTION_ITEM=BOOKMARK.

PLAY_MEDIA—Specifies that the type of action associated with the ACTION_ITEM is to play a movie or sound clip. Used for ACTION_ITEM=MEDIA.

DIGSIG_FIELD—Specifies that the type of action associated with the ACTION_ITEM is to define a Digital Signature field. Used when ACTION_ITEM=FIELD.

AREA_OF_INTEREST—Specifies that the type of action associated with the ACTION_ITEM is to create a bookmark to a particular section or view in a document. This section or view is defined by the accumulated rectangular rangebox of the element(s) that matches the design script criteria.

FILE_ATTACHMENT—Specifies that the type of action associated with the ACTION_ITEM is a file. Used for ACTION_ITEM=ATTACHMENT.

SOUND_ATTACHMENT—Specifies that the type of action associated with the ACTION_ITEM is a sound clip. Used for ACTION_ITEM=ATTACHMENT.

MOVIE_ATTACHMENT—Specifies that the type of action associated with the ACTION_ITEM is a movie clip. Used for ACTION_ITEM=ATTACHMENT.

TEXT_DESCRIPTION—Specifies that the type of action associated with the ACTION_ITEM is a text description extracted from the DGN file. Used for ACTION_ITEM=BOOKMARK.

Syntax
ACTION_TYPE=<WEB_URL|DESTINATION|DOCUMENT|PLAY_SOUND|PLAY_MEDIA|DIGSIG_FIELD|ACTION_RANGE|FILE|SOUND|MOVIE|TEXT_DESCRIPTION>

ACTION_NAME/ACTION_SPEC

ACTION_NAME and ACTION_SPEC values are not preset constants. Rather, they are unique values that correspond to the ACTION_ITEM and ACTION_TYPE being defined.

ACTION_NAME is typically the internal, unique name to identify the object being defined by ACTION_ITEM. The exception is when you are identifying a Web Link bookmark or a Sound Clip bookmark. For Web Link bookmarks, the action_name keyword identifies the URL. For sound clip bookmarks, the action_name identifies the file specification of the sound file. Action_name is a required field when defining an ACTION_ITEM.

ACTION_SPEC specifies the position of the bookmark in the bookmark hierarchy, the file specification for MEDIA or ATTACHENT items, the string that is displayed when the user hovers over the digital signature field in Acrobat, and the explicit name of the marker (i.e. sheet_name.marker_name) for a link. This is a required field when defining an ACTION_ITEM, except for MARKER items.

Syntax:
ACTION_NAME=string
ACTION_SPEC=string

The following table provides a list of acceptable values for each corresponding ACTION_TYPE.

| ACTION_TYPE | ACTION_NAME | ACTION_SPEC |
|---|---|---|
| DIGSIG_FIELD | Unique string to identify this particular digital signature item. | String that is displayed when the user hovers over the digital signature field in Acrobat. |
| DOCUMENT | Unique string used as identifier for the link or a sheet name in a Document Bookmark. | Specifies the position of the bookmark in the bookmark hierarchy. For links, it specifies the explicit name of the marker (i.e. sheet_name.marker_name). |
| WEB_URL | Unique name used as an identifier for a link. URL HTTP specification for a bookmark. | Specifies the position of the bookmark in the bookmark hierarchy and defines the bookmark entry name. For Web URL links, it specifies the URL address. |
| AREA_OF_INTEREST | Unique string to identify this particular bookmark item. | Specifies the position of the bookmark in the bookmark hierarchy. |
| PLAY_SOUND | File specification of the sound file. | Specifies the position of the bookmark in the bookmark hierarchy. |
| PLAY_MEDIA | Unique name for a movie or sound clip. | Movie or sound file specification. |
| DESTINATION | Unique name for the marker. | Not applicable |
| FILE_ATTACHMENT | Unique name for the attachment. | File specification. |
| SOUND_ATTACHMENT | Unique name for attachment. | Sound file specification |
| MOVIE_ATTACHMENT | Unique name for attachment | Movie file specification |
| TEXT_DESCRIPTION | Unique string to identify this particular bookmark item. | Specifies the position of the bookmark in the bookmark hierarchy. |

ACTION_RANGE

The ACTION_RANGE keyword specifies the basic range when determining the rectangular area in creating a link, field, marker, attachment, media, or an AREA_OF_INTEREST bookmark ACTION_ITEM. The default value is ELEMENT_RANGE. The following constants are valid for the ACTION_RANGE keyword:

ELEMENT_RANGE—Specifies that the range associated with the ACTION_RANGE is the range of the current element.

CELL_RANGE—Specifies that the range associated with the ACTION_RANGE is the range of the cell associated with the current element.

Syntax
ACTION_RANGE=<ELEMENT_RANGE|CELL_RANGE>
ACTION_INSTANCE

If the ACTION_RANGE is set to CELL_RANGE or ELEMENT_RANGE, ACTION_INSTANCE specifies that the rectangular area (for a link or AREA_OF_INTEREST bookmark ACTION_ITEM) will be calculated using the current CELL or ELEMENT's range, or calculated based on the sum of all the CELL_RANGE or ELEMENT_RANGEs that match this link's criteria. The following constants are valid for the ACTION_INSTANCE keyword:

SINGLE_INSTANCE—Specifies that the rectangular area for an ACTION_ITEM will be calculated based on the sum of all the CELL_RANGE or ELEMENT_RANGEs that match this item's design script criteria.

MULTIPLE_INSTANCE—Specifies that the rectangular area for an ACTION_ITEM is calculated using the current CELL or ELEMENT's range.

Syntax
ACTION_RANGE=<SINGLE_INSTANCE|MULTIPLE_INSTANCE>

Global Action Keywords

The following action keywords can be used as assignment statements, except for the FIRST_TIME keyword.

SHEET_NAME—Specifies the name of the current sheet and associated bookmark for the current page being published. Default value is plot_name.

Syntax
SHEET_NAME=string

IGNORE_ENGINEERING_LINKS—Specifies that if an engineering link is encountered do not automatically include it as a link in the resulting rendered document. Default value is FALSE.

Syntax
IGNORE_ENGINEERING_LINKS=<TRUE|FALSE>

IGNORE_CUSTOM_LINKS—Specifies that if a custom link is encountered do not automatically include it as a link in the resulting rendered document. Default value is FALSE.

Syntax
IGNORE_CUSTOM_LINKS=<TRUE|FALSE>

IGNORE_ALL_LINKS—Specifies that if any links are encountered do not include them as a links in the resulting rendered document. Default value is FALSE.

Syntax
IGNORE_ALL_LINKS=<TRUE|FALSE>

BOOKMARK_TEMPLATE—An XML file that defines the layout of the bookmark hierarchy.

Syntax
BOOKMARK_TEMPLATE=file specification to the XML file

If a file specification begins with a number, you need to precede the number with forward slashes or two backslashes. For example, bookmark_template="c:\my templates\\2004.xml," or bookmark_template="c:/my templates/2004.xml."

ZOOM_PERCENTAGE—Enables you to control how the surrounding region is displayed when you click on an AREA_OF_INTEREST bookmark or a link to a MARKER. If you specify a zoom percentage of 100, the rectangular region is fitted into the Acrobat viewer's current window area. A value of 150 designates an area 50 percent larger than the exact boundary of the MARKER or rectangular region. The default value for zoom percentage is 120. The order in which the zoom_percentage keyword appears in the design script is very important. The zoom_percentage keyword needs to follow the action_item and action_name keywords.

Syntax
ZOOM_PERCENTAGE=integer (where 100 is 100%)

FIRST_TIME—This comparison keyword enables you to place a segment of design script code that is executed only once. This keyword is TRLE the first time this design script code is called, and then the value is set to FALSE. This value cannot be reset.

Syntax
FIRST_TIME=<TRUE|FALSE>

ELEMENT_URL—Specifies the URL, custom or Bentley Engineering Link associated with this element. If no URL exists the value of the string is NULL.

Syntax
ELEMENT_URL=string
ELEMENT_URL_DESCRIPTION—Specifies the URL description, custom or Bentley Engineering Link associated with this element. If no URL description exists the value of the string is NULL.
Syntax
ELEMENT_URL_DESCRIPTION=string There are many electronic navigation aids available in e-paper (electronic paper/plots) technologies available today. As an example, Adobe offers in Adobe Acrobat and Adobe Reader many navigational aids. They include bookmarks, internal document links, and attachments. These are the navigational aids that would be constructed by, for example, the scripting language described above that exploits an organization's CAD standards.

Bookmarks are a hierarchal collection of text labels. Selecting one of the text labels, using the computers input device, would cause the e-paper/plot viewer to navigate to specific information.

The following is an example of a design script that exploits a CAD standard to create bookmark navigational aids. The CAD standard would insure that the design script could be used on any index sheet created for any project by the organization. The design script would apply to all index pages created for any project that complied with the CAD standard.

The CAD standard requires that:

1. All Index sheets be named "INDEX OF SHEETS"
2. That all text on level 10 be names of sheets in the plan set.
3. That the text contained within a shape on level 9 be the names of sheets within the Plan Set
4. That the text contained within a shape on level 10 be Notes for the Plan Set
5. That the text contained within a shape on level 11 be Disclaimer text for the Plan Set
6. Shapes with a weight of 2 and a color of 8 are signature fields

```
If (PLOT_NAME .eq. 'INDEX OF SHEETS') then
    If (type .eq. text) then
        If (level .eq. 10) then
            ! Sheet Names in Index Grid
            action_item = LINK
            action_name = characters   !Unique name
            action_type = DOCUMENT         !Internal LINK in PDF document
            action_spec = characters   !Link target (goto)
        endif
    endif
    If (type .eq. shape) then
        If (level .eq. 9) then
            !Index grid frame
            action_item = BOOKMARK
            action_type = AREA_OF_INTEREST
            action_name = 'Sheet index'           !Unique Name
            action_range = ELEMENT_RANGE    !Target of link from
Bookmark is range of shape
            action_spec = './'                    !Location of Bookmark in
hierarchy
        endif
        If (level .eq. 10) then
            !Notes Frame
            action_item = BOOKMARK
            action_type = AREA_OF_INTEREST
            action_name = 'Notes'      !Unique Name
            action_range = ELEMENT_RANGE     !Target of link from
Bookmark is range of shape
            action_spec = './'                    !Location of Bookmark in
hierarchy
        endif
        If (level .eq. 11) then
            !Disclaimer Frame
            action_item = BOOKMARK
            action_type = AREA_OF_INTEREST
            action_name = 'Disclaimer'           !Unique Name
            action_range = ELEMENT_RANGE    !Target of link from
Bookmark is range of shape
            action_spec = './'                    !Location of Bookmark in
hierarchy
        endif
        if (weight .eq. 2) then
            if (color .eq. 8) then
                ! Create a Digital Signature Field
                action_item = FIELD
                action_name = Plot_Name + '.ProjectEng'      !ID's field
uniquely
                action_type = DIGSIG_FIELD
                action_spec = ' P.E. - Sigh Here'                !Tool tip
                ! Create a bookmark to this Digital Signature field
                action_item = BOOKMARK
                action_type = AREA_OF_INTEREST
```

-continued

```
            action_name = 'Digital Signature'        !Bookmark name
            action_type = ACTION_RANGE              !use element range
            action_spec = './'
        endif
      endif
    endif
endif
```

An electronic plot in PDF format is shown in FIGS. 5-10. The plots were created from a CAD file drafted with the above drafting standards using the above script. Each successive screen shot of Acrobat shows the action of the viewer when navigating the bookmarks.

Figure 5:
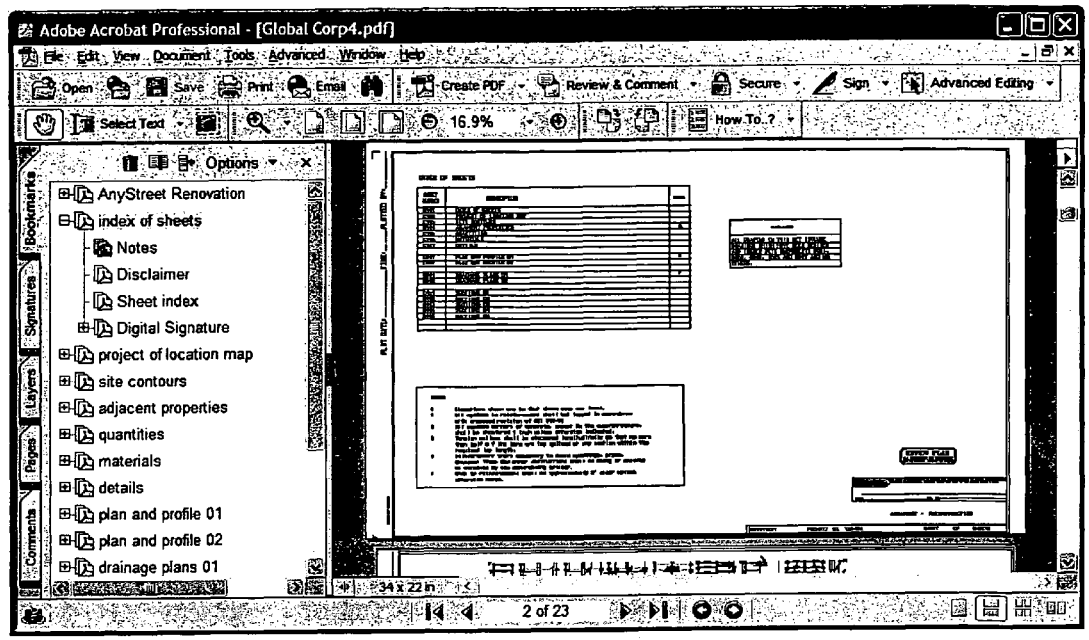
FIGS. 5-10 depict graphical user interfaces according to an exemplary embodiment of the present invention
Figure 6:
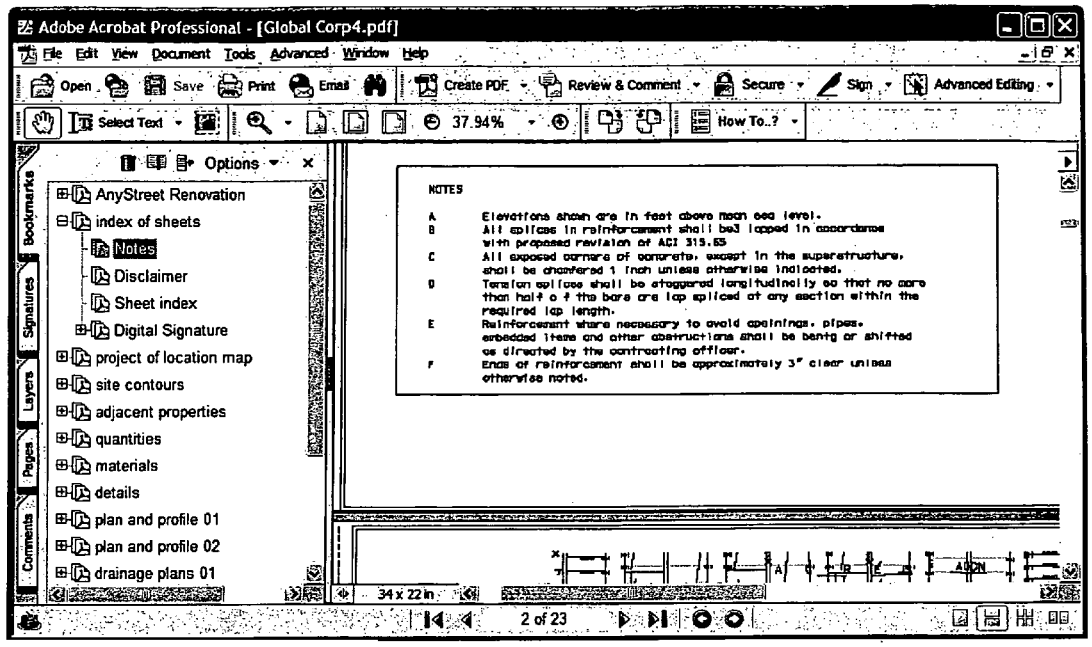
Figure 7:
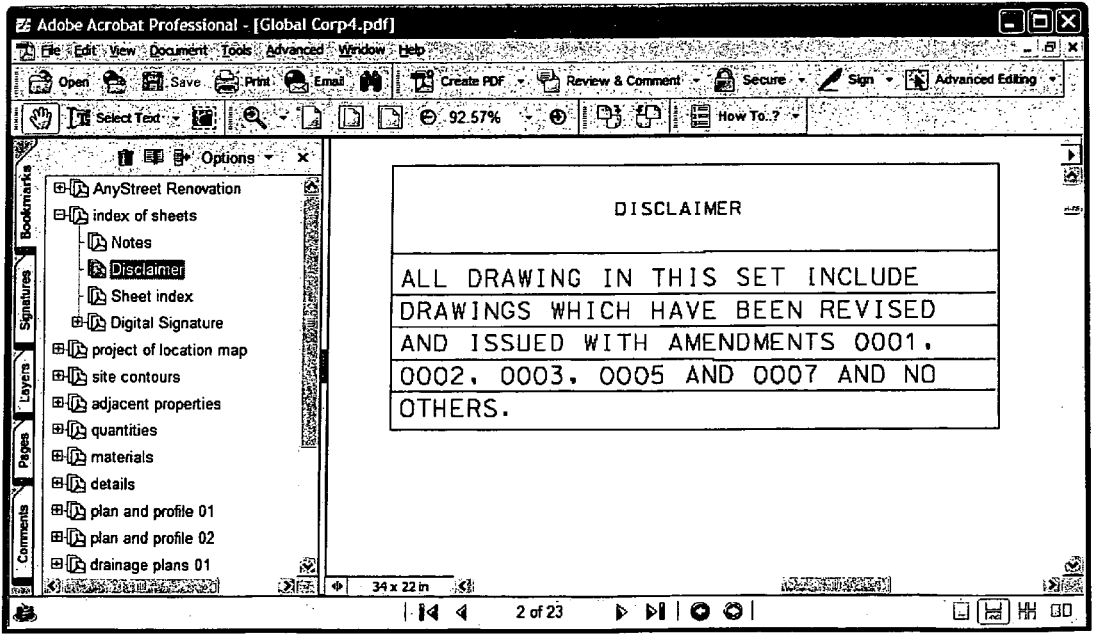
Figure 8:
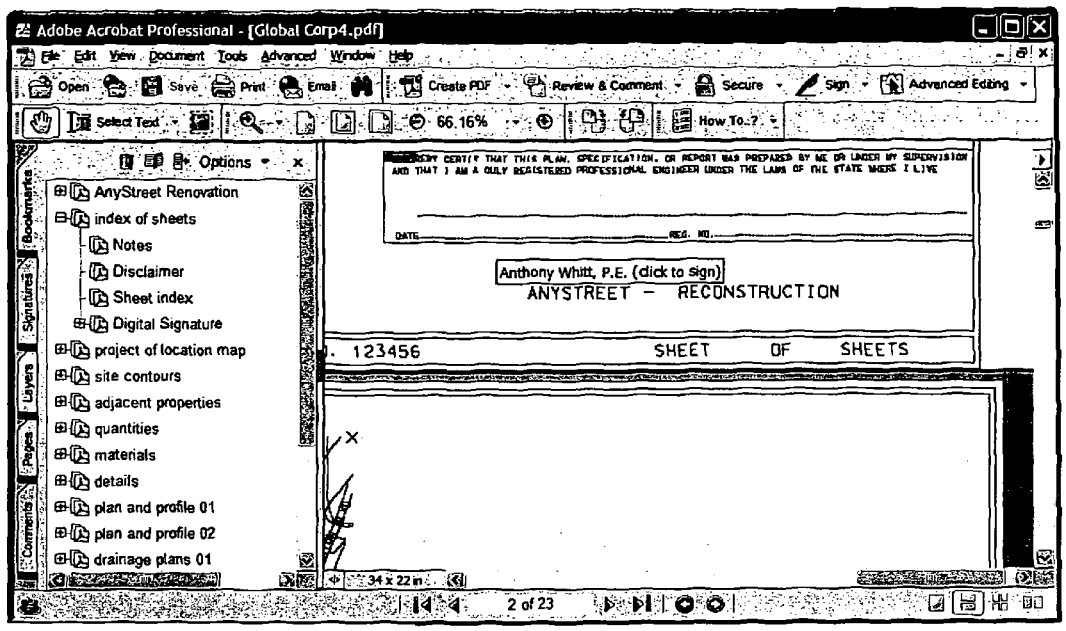

FIG. 5 shows an initial display of the sheet index. In the bookmark section of the display the index of sheets includes several sub-selections, Notes, Disclaimer, Sheet Index, and Digital Signature. A user may select the Notes item with a computer input device. In that case, as shown in FIG. 6, the Notes section of the plan set is displayed. When the Disclaimer bookmark is selected, the Disclaimer section of the plan set is displayed to the user. Similarly, when the user selects the Digital Signature and sheet index bookmarks, the user is directed to the Digital Signature and sheet index for the plan set, respectively, as shown in FIGS. 8 and 9.

Figure 9:
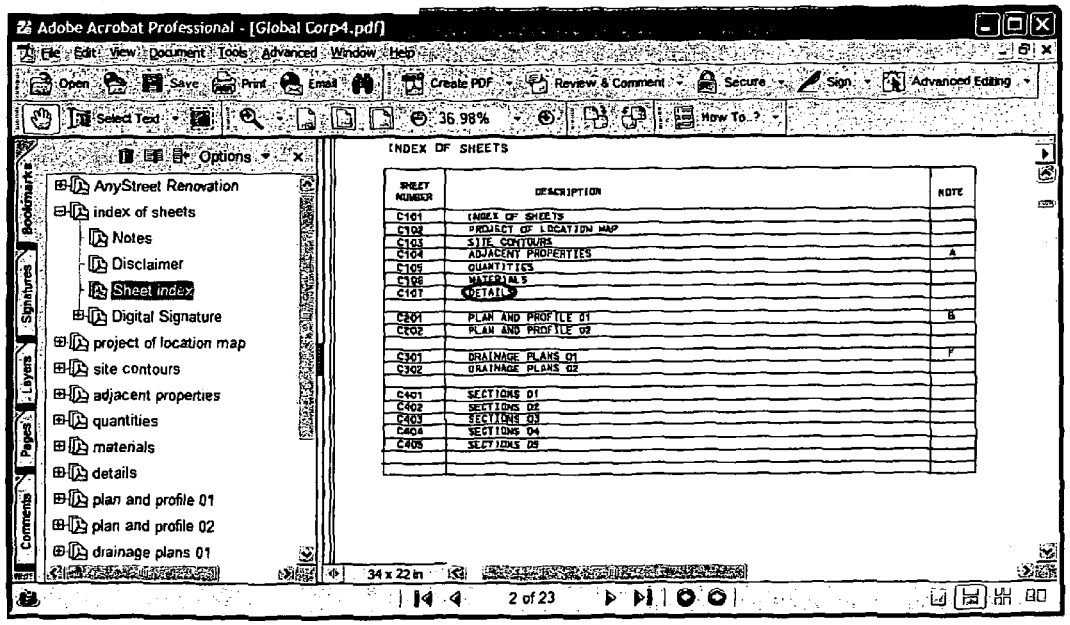
Figure 10:
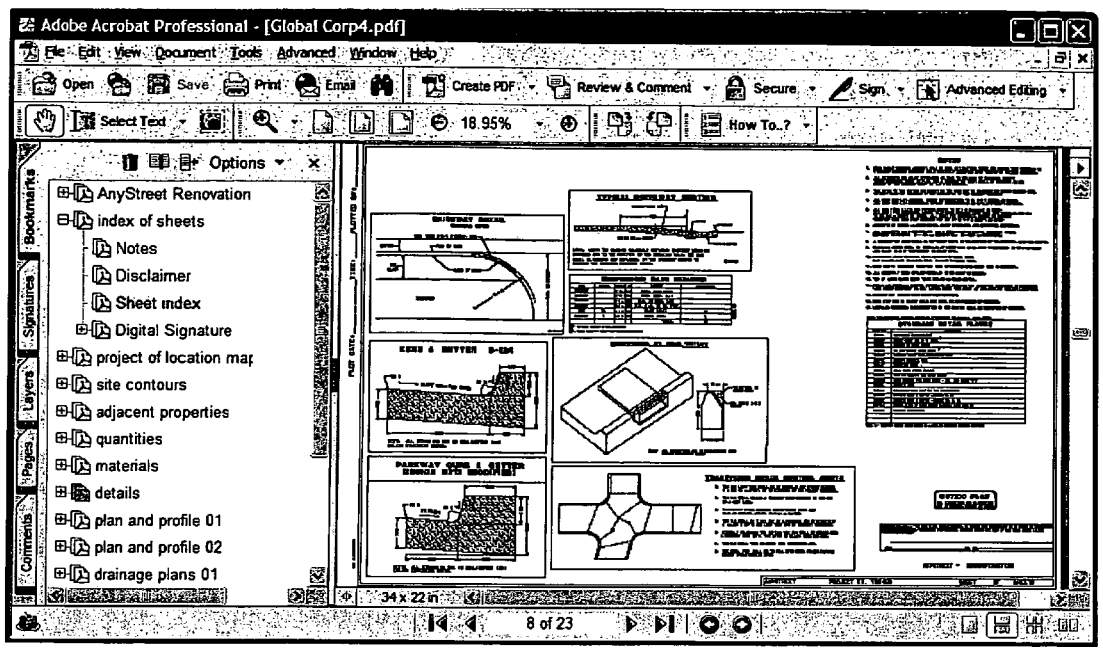

FIG. 9 shows the sheet index for the plan set. The script above creates links from the descriptive text found in the sheet index to the sheets that the text references. For example, by selecting the Details text circled in FIG. 9, the user automatically navigates to the Details sheet, as shown in FIG. 10.

Bookmarks and inter-document links are just a few of the features that can be created exploiting CAD standards and a scripting language. Many others are possible. For example, the following extension to the CAD standard and script would provide a method for navigating between engineering plans and specification.

The CAD standard requires that:
1. Text describing material types used, be place on a level named "Material Name"
2. Specifications of materials are placed on the file system in a directory call "Material Documents" in PDF format.
3. The file name must be the same string as the material type described in 1.

```
If (type .eq. text) then
    If (level_name .eq. 'Material Name') then
        !PDF Specifications file name
        action_item = ATTACHMENT
        action_name = 'SpecPDF' + characters
        action_type = FILE_ATTACHMENT
        action_spec = 'D:\Material Documents\' + characters + '.pdf'
    Endif
Endif
```

Embodiments of the invention provide a system and method that is easy to setup, administer, and execute that also provides reproducible results that are easy for the consumer of the published document to use effectively by applying their discipline specific knowledge for plan set navigation without significant training. Existing CAD files may be examined and features added thereto based on drafting standards. The embodiments illustrated and discussed in this specification are intended only to teach those skilled in the art the best way known to the inventors to make and use the invention. Nothing in this specification should be considered as limiting the scope of the present invention. The above-described embodiments of the invention may be modified or varied, and elements added or omitted, without departing from the invention, as appreciated by those skilled in the art in light of the above teachings. For example, the order in which the steps are performed may be varied as long as the above-described dependencies are maintained. It is therefore to be understood that, within the scope of the claims and their equivalents, the invention may be practiced otherwise than as specifically described.

We claim:

1. A method, comprising:
receiving, at a computer, a computer-aided design (CAD) file that includes a plurality of data in a first format, the plurality of data including at least one of graphics or text;
comparing at least one of the graphics or text in the CAD file with a CAD drafting standard to identify graphics or text in the CAD file that corresponds to a defined feature in the CAD drafting standard;
extracting, with the computer, the identified graphics and/or text that corresponds to the defined feature from the CAD file;
interpreting, by the computer, the extracted graphics and/or text based on the defined feature to obtain enhanced feature information from the extracted graphics and/or text; and
creating with the computer, based on the CAD drafting standard, a second file in a second format, including:
the enhanced feature.

2. The method of claim 1, wherein the enhanced feature is a link or bookmark.

3. The method of claim 1, further comprising:
examining the data to determine a target of the link or bookmark; and
creating a link to the target.

4. The method of claim 1, wherein the data represent text and graphics.

5. The method of claim 1, wherein the second format is one of DWF, XPS or PDF.

6. The method of claim 1, wherein the enhanced feature is one of audio or video instructions, bookmarks, internal document links, Web URL Links, or attachments.

7. The method of claim 1, further comprising receiving the definition of the feature.

8. The method of claim 7, wherein the definition of the feature includes the definition of a detail reference.

9. The method of claim 8, wherein the definition of the feature is defined by a script based on a scripting language, the script defining the graphics and text to be identified in the CAD file and defining the creation of the enhanced feature in the second file based on the enhanced feature information.

10. The method of claim 1, further comprising persisting the enhanced feature in the second file.

11. The method of claim 1, further comprising providing a scripting language to perform the method.

12. A non-transitory computer readable medium including computer program code for causing a computer to perform the steps of:
   comparing at least one of the graphics or text in a computer-aided design (CAD) file that includes a plurality of data in a first format with a CAD drafting standard to identify graphics and/or text in the CAD file that corresponds to a defined feature in the CAD drafting standard;
   extracting, by the computer, the identified graphics and/or text that corresponds to the defined feature from the CAD file;
   interpreting, with the computer, the extracted graphics and/or text based on the defined feature to obtain enhanced feature information from the extracted graphics and/or text; and
   creating, with the computer, based on the CAD drafting standard, a second file in a second format, including:
      the enhanced feature.

13. The computer readable medium of claim 12, further comprising computer program code for causing a computer to perform the steps of:
   determining the defined feature that corresponds to the identified graphics and/or text based on the definition of the feature.

14. The computer readable medium of claim 12, further comprising computer program code for causing a computer to perform the steps of:
   defining a scripting language for defining in the definition of the feature, the preselected graphics and text and the corresponding defined feature.

* * * * *